(12) United States Patent
Lee et al.

(10) Patent No.: US 10,539,751 B2
(45) Date of Patent: *Jan. 21, 2020

(54) OPTICAL BENCH ON SUBSTRATE

(71) Applicant: TAIWAN SEMICONDUCTOR MANUFACTURING COMPANY, LTD., Hsinchu (TW)

(72) Inventors: Wan-Yu Lee, Taipei (TW); Chun-Hao Tseng, Taichung (TW); Hai-Ching Chen, Hsinchu (TW); Tien-I Bao, Dayuan Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/247,332

(22) Filed: Jan. 14, 2019

(65) Prior Publication Data

US 2019/0146165 A1    May 16, 2019

Related U.S. Application Data

(63) Continuation of application No. 13/403,566, filed on Feb. 23, 2012, now Pat. No. 10,180,547.

(51) Int. Cl.
*G02B 6/42* (2006.01)
*H01S 5/022* (2006.01)
*H01S 5/00* (2006.01)

(52) U.S. Cl.
CPC ......... *G02B 6/4214* (2013.01); *G02B 6/4246* (2013.01); *H01S 5/02252* (2013.01); *H01L 2924/0002* (2013.01); *H01S 5/005* (2013.01)

(58) Field of Classification Search
CPC .......... G02B 6/12; G02B 6/43; G02B 6/4214; G02B 6/42
See application file for complete search history.

(56) References Cited

U.S. PATENT DOCUMENTS

| 5,391,917 A | 2/1995 | Gilmour et al. |
| 5,510,298 A | 4/1996 | Redwine |

(Continued)

FOREIGN PATENT DOCUMENTS

| CN | 1910486 | 2/2007 |
| TW | 201131229 | 9/2011 |
| TW | 20114231 | 12/2011 |

OTHER PUBLICATIONS

Office Action dated Mar. 5, 2014 from corresponding application No. TW 101122935.

*Primary Examiner* — Thomas A Hollweg
*Assistant Examiner* — Mary A El-Shammaa
(74) *Attorney, Agent, or Firm* — Hauptman Ham, LLP (57) ABSTRACT

A method of making an optical bench includes forming a trench in a substrate and wherein the trench has a sloping side, forming a reflector layer over the sloping side, depositing a redistribution layer over the substrate, disposing an under bump metallization (UBM) layer over the redistribution layer, depositing a passivation layer over the redistribution layer and surrounding sidewalls of the UBM layer, and mounting an optical component over an uppermost portion of the substrate, wherein the optical component is electrically connected to a through substrate via (TSV) extending through the substrate. The reflector layer is configured to reflect an electromagnetic wave from the optical component, and wherein the optical component is mounted outside the trench.

20 Claims, 6 Drawing Sheets

(56) References Cited

U.S. PATENT DOCUMENTS

| | | |
|---|---|---|
| 5,767,001 A | 6/1998 | Bertagnolli et al. |
| 5,987,202 A | 11/1999 | Gruenwald et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,807,218 B1 | 10/2004 | Greenwood et al. |
| 6,832,013 B1 | 12/2004 | Kuhmann et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 9,618,712 B2 | 4/2017 | Kuo et al. |
| 2003/0113067 A1 | 6/2003 | Koh et al. |
| 2003/0161603 A1 | 8/2003 | Nadeau et al. |
| 2004/0091211 A1 | 5/2004 | Umebayshi et al. |
| 2004/0202428 A1 | 10/2004 | Hwang et al. |
| 2005/0063634 A1 | 3/2005 | Cohen et al. |
| 2005/0100264 A1 | 5/2005 | Kim et al. |
| 2005/0224946 A1 | 10/2005 | Dutta et al. |
| 2006/0239605 A1 | 10/2006 | Palen et al. |
| 2009/0022500 A1 | 1/2009 | Pinguet et al. |
| 2009/0129783 A1 | 5/2009 | Ori et al. |
| 2010/0119231 A1 | 5/2010 | Kim et al. |
| 2010/0215314 A1 | 8/2010 | Lau et al. |
| 2010/0266241 A1 | 10/2010 | Hosoda |
| 2011/0102894 A1 | 5/2011 | Detry et al. |

OPTICAL BENCH ON SUBSTRATE

PRIORITY CLAIM

The present application is a continuation of U.S. application Ser. No. 13/403,566, filed Feb. 23, 2012, which is incorporated herein by reference in its entirety.

TECHNICAL FIELD

The present disclosure relates generally to an integrated circuit.

BACKGROUND

A multi-chip module package (MCM) integrates chips with different functions and made of different processes. Some MCMs utilize substrate materials based on ceramic or organic polymers, which, in certain configurations, may have insufficient coefficient of thermal expansion (CTE) matching to semiconductor chips and/or heat dissipation property. This causes potential reliability issues for III-V semiconductor material based optoelectronic chips and/or high power amplifiers.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
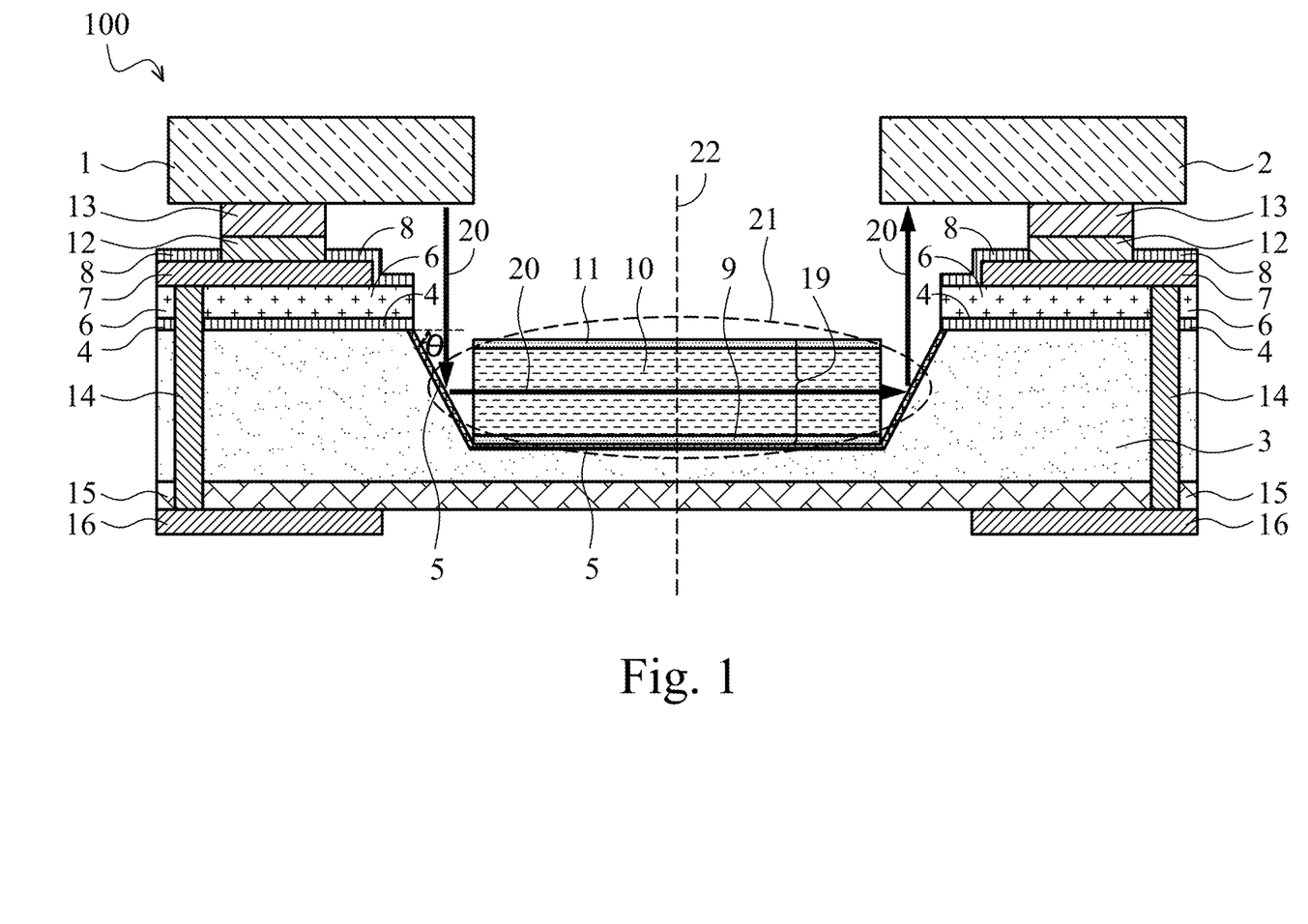
FIG. 1 is a schematic diagram of an optical bench on substrate according to some embodiments.

FIG. 1 is a schematic diagram of an optical bench 100 on substrate according to some embodiments. The optical bench 100 includes a laser diode 1 and a photo diode 2 mounted on a substrate 3. The laser diode 1 and the photo diode 2 comprise III-V semiconductor materials and operate on electromagnetic wavelengths in the range of 450 nm-1700 nm in some embodiments. The substrate 3 can comprise any suitable material, such as silicon. An etching hard mask 4 comprises SiN or $SiO_2$ and can achieve at least 30 □m etch depth in some embodiments. The etching hard mask layer 4 over the area for a trench 21 and/or an optical waveguide 19 is removed. In some examples, the etching hard mask layer 4 comprises SiN of at least 30 nm in thickness. In further examples, the etching hard mask layer 4 comprises $SiO_2$ of at least 100 nm in thickness. A reflector layer 5 comprises at least one of Cu, Al, Ag, or Au, multi-layered dielectrics, or any other suitable material having a reflective property at desired electromagnetic wavelengths. In some embodiments, the reflector layer 5 has at least 90% reflectivity at selected wavelengths.

A dielectric layer 6 can comprise $SiO_2$ or other low-k dielectric materials such as porous $SiO_2$, organic polymers such as polymide or Polybenzobisoxazole (PBO), or hybrid-organic polymers such as polysiloxane. To achieve high performance at radio frequency (RF) and microwave frequency, the thickness of the dielectric layer 6 is at least 300 nm for high resistance silicon substrate (resistivity >3000 ohm-cm) in some embodiments. The thickness of the dielectric layer 6 is at least 1 μm for normal wafers (resistivity is from 1 ohm-cm to 10 ohm-cm) in some embodiments.

A redistribution layer (RDL) 7 formed over the substrate 3 is a metal layer on a chip that allows the Input Output (IO) pads of an integrated circuit available in other locations. The RDL 7 comprises Al, Cu, or any other suitable electrically conductive material, and has more than 1 μm thickness for high speed applications over 2 Gbps in some embodiments. A passivation layer 8 comprises $SiO_2$, SiON, SiN, multi-stacks of these materials, or any other suitable materials. The thickness of the passivation layer 8 is about 200 nm-800 nm for pad protection in some embodiments.

A bottom cladding layer 9 comprises $SiO_2$/SiON formed by plasma-enhanced chemical vapor deposition (PECVD) in some embodiments. In other embodiments, spin-on dielectrics or polymers can be used to form the bottom cladding layer 9. The thickness of the bottom cladding layer 9 is at least 500 nm in some embodiments to prevent optical leak. A core layer 10 comprises SiON/SiN formed by plasma-enhanced chemical vapor deposition (PECVD) in some embodiments. In other embodiments, spin-on dielectrics or polymers can be used to form the core layer 10. The thickness of the core layer 10 is at least 15 □m in some embodiments. A top cladding layer 11 comprises $SiO_2$/SiON formed by plasma-enhanced chemical vapor deposition (PECVD) in some embodiments. In other embodiments, spin-on dielectrics or polymers can be used to form the top cladding layer 11. The thickness of the top cladding layer 11 is at least 500 nm in some embodiments to prevent optical leak. In some embodiment, an optical fiber can be placed in the trench 21 as the waveguide 19.

The bottom cladding layer 9, the core layer 10, and the top cladding layers 11 form the waveguide 19 inside a trench 21 as an optical link medium for the electromagnetic wavelengths used by the laser diode 1 and/or the photo diode 2. The refractive index of the core layer 10 is higher than that of the bottom and top cladding layers 9 and 11, and the refractive index difference is at least 0.02 in some embodiments to prevent optical leak. In one example, three polymer layers for the bottom cladding layer 9, the core layer 10, and the top cladding layer 11 are deposited by a spin on process, then a lithography process is used to define the optical waveguide 19. An optical path 20 shows an exemplary light path of light (electromagnetic wave) emitted from the laser diode 1, reflected by a sloping side of the reflector layer 5, through the optical waveguide 19, reflected by another sloping side of the reflector layer 5, then to the photo diode 2.

An under bump metallization (UBM) layer 12 comprises any suitable under-bump metallurgy, e.g., Cu/Ni. A solder bump layer 13 can comprise lead-free solder or gold bumps in some embodiments. The solder bump layer 13 comprises micro bumps for flip-chip bonding with semiconductor-based optical and electrical chip in some embodiments. The overall thickness for the UBM layer 12 and the solder bump layer 13 is 1 µm-15 µm in some embodiments. Through substrate vias (TSVs) 14 formed through the substrate 3 comprises Cu or any other suitable electrically conductive materials. The TSVs 14 can be used to provide backside electrical connections, and can be fabricated using any suitable methods and materials known in the art.

Another dielectric layer 15 can comprise $SiO_2$ or other low-k dielectric material such as porous $SiO_2$, organic polymers such as polymide or Polybenzobisoxazole (PBO), or hybrid-organic polymers such as polysiloxane. To achieve high performance at radio frequency (RF) and microwave frequency, a thickness of the dielectric layer 6 is at least 300 nm for high resistance silicon substrate (resistivity >3000 ohm-cm) in some embodiments. The thickness is at least 1 µm for normal wafers (resistivity is from 1 ohm-cm to 10 ohm-cm) in some embodiments. A backside redistribution layer (RDL) 16 comprises Al, Cu, or any other suitable electrically conductive material, and has more than 1 µm thickness for high speed applications over 2 Gbps in some embodiments.

The trench 21 has sloping sides with a slope angle θ ranging from 42° to 48° and has a depth more than 30 µm in some embodiments to accommodate the diverged optical beam from the laser diode 1, e.g., a vertical cavity surface emitting laser (VCSEL). Some laser diode 1 has a beam diversion angle of about 20°-30° with a beam size of about 10 µm-15 µm.

The integrated optical bench 100 on substrate allows coupling the light from the laser diode 1 to the reflector layer 5 and into the waveguide 19. It also leads the light out of waveguide 19 to the reflector layer 5 to be received by the detector diode 2. The optical bench 100 on substrate can also be implemented with one portion on either side of the line 22. For example, in one or more embodiments, the optical bench 100 includes the transmitting portion on the left side of the line 22 and having the laser diode 1 as a transmitter. In one or more embodiments, the optical bench 100 includes the receiving portion on the right side of the line 22 and having the photo diode 2 as a receiver. The large waveguide 19 dimension (greater than 15 µm in some embodiments) also allows light to couple into and out of optical fibers for out-of-chip communication.

The optical bench 100 on substrate structure can provide better CTE matching and/or heat dissipation for optical components such as the laser diode 1 and the photo diode 2 mounted on the substrate 3 when the substrate 3 comprises semiconductor materials such as silicon, compared to other substrate or interposer materials such as ceramic or organic polymer. More robust and cost efficient integration of optics using silicon micro-fabrication technology is achieved by the optical bench 100 on substrate compared to some other assembly using discrete optical components. Also, there is less crosstalk among optical channels by using the optical waveguide 19 for secure data transfer.

Furthermore, by configuring the optical bench 100 as a transmitting portion (e.g., the portion on the left side of the line 22 and having the laser diode 1 as a transmitter), or as a receiving portion (e.g., the portion on the right side of the line 22 and having the photo diode 2 as a receiver), it is possible to add optical input/output off the package. This optical bench 100 on substrate platform offers higher data rates inside the package by integrating optical components and optical options for signal input and output.

Figure 2A:
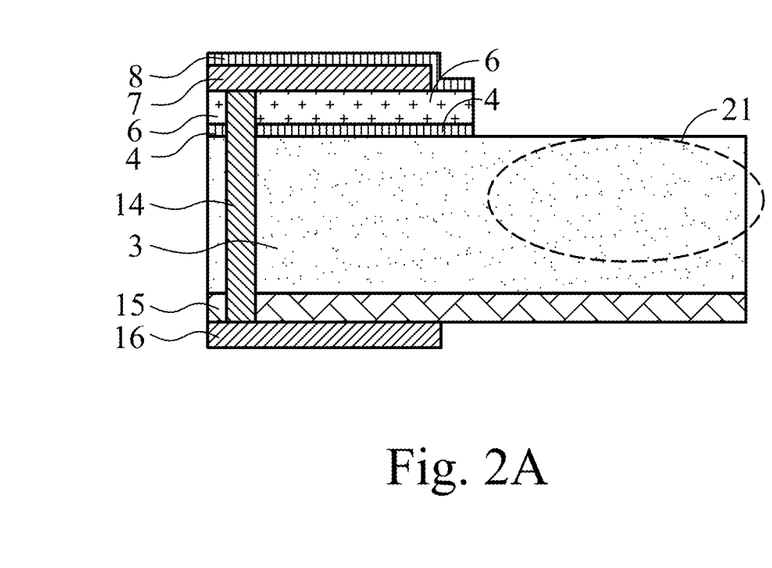
FIGS. 2A-2E are schematic diagrams of various steps of fabrication process of the optical bench on substrate in FIG. 1 according to some embodiments.

FIGS. 2A-2E are schematic diagrams of various steps of fabrication process of the optical bench on substrate in FIG. 1 according to some embodiments. In FIG. 2A, the RDL 7 is formed over the dielectric layer 6, e.g., by physical vapor deposition (PVD), for metal routing and metal traces for high speed electrical signal propagation. The passivation layer 8 (e.g., silicon nitride or oxide) is deposited afterward for metal protection, e.g., by chemical vapor deposition (CVD). The passivation layer 8, the dielectric layer 6, and the etching hard mask 4, e.g., silicon nitride or silicon oxide, are removed from an area where the trench 21 is to be formed.

Figure 2B:
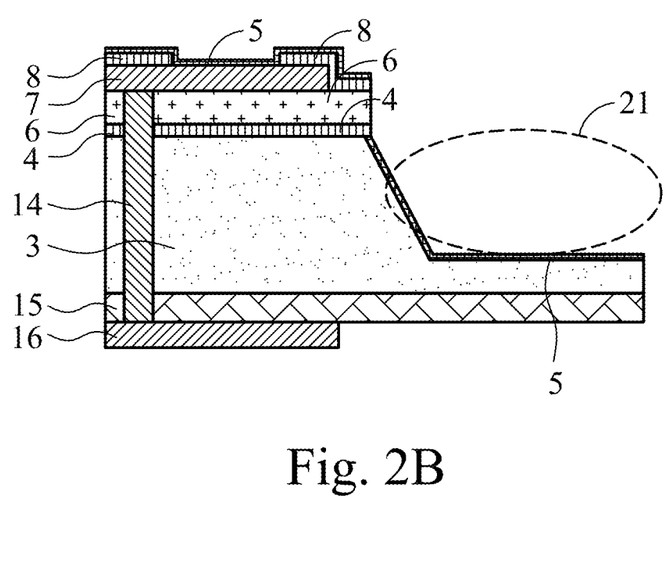

In FIG. 2B, the trench 21 (having at least 30 µm depth in some embodiments), including the sloping sides with a slope angle θ, is fabricated by wet etching using KOH(aq)/IPA or TMAH solution. One method to control the anisotropic wet etching is achieved by using KOH (25 wt %-35 wt %) with no less than 5 wt % IPA quantity. The temperature is kept at about 60° C.-70° C. during the wet etching to achieve a reasonable etch rate of 0.2-0.6 micron per minute during the wet etching and to prevent excessive hillock formation.

The reflector layer 5 having sloping sides with a slope angle θ (e.g., 42°-48°) is formed on the trench 21. This step may include depositing an adhesion dielectric layer, then a barrier/adhesion metal layer, such as Ti or Cr, and finally a highly reflective metal such as Al, Cu, Ag, or Au with a thickness greater than 50 nm to achieve reflectivity greater than 90% in some embodiments. The deposition process can be performed by physical vapor deposition (PVD) or electroplating, for example. Any other suitable reflective material or process can also be used.

Figure 2C:
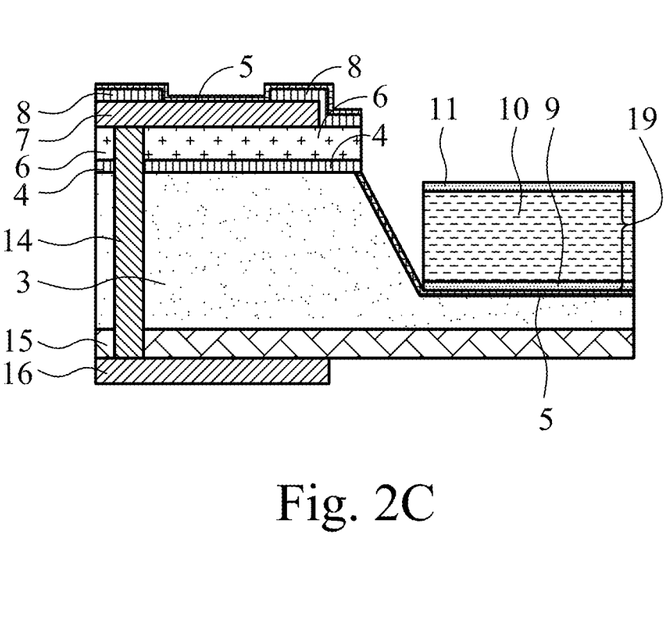

In FIG. 2C, the waveguide 19, e.g., polymer, for the optical path inside the trench 21 is formed. This step includes forming the bottom cladding layer 9 (e.g., dielectric or polymer) by chemical vapor deposition (CVD) or a coater (for dielectric or polymer), then the core layer 10 (e.g., polymer), and the top-cladding layer 11 (e.g., dielectric or polymer) in some embodiments. The waveguide 19 can be defined by etching and unnecessary portion of the reflector layer 5 can also be removed. In other embodiments, a portion of an optical fiber can be placed in the trench 21 as the waveguide 19.

Figure 2D:
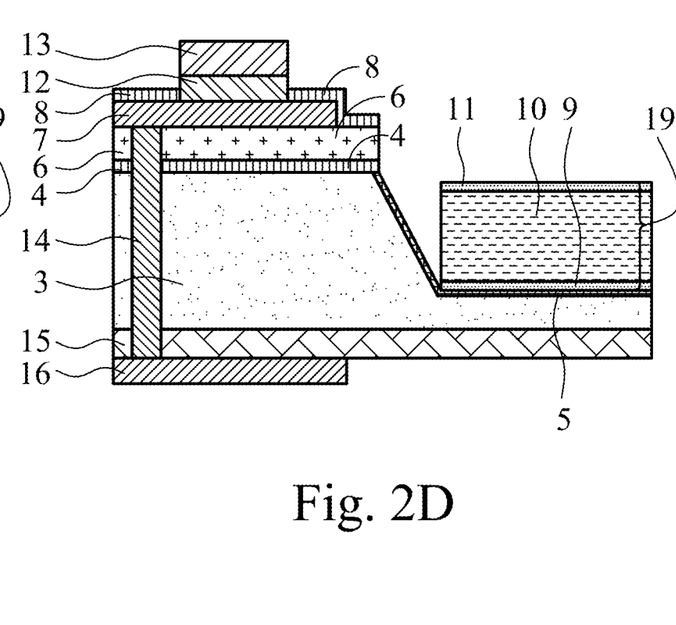

In FIG. 2D, the UBM layer 12 such as Cu/Ni is formed, e.g., by evaporation or sputtering, or by chemically plating. A solder bump layer 13 is formed or placed on the UBM layer 12 in many ways, including evaporation, electroplating, printing, jetting, stud bumping, and direct placement.

Figure 2E:
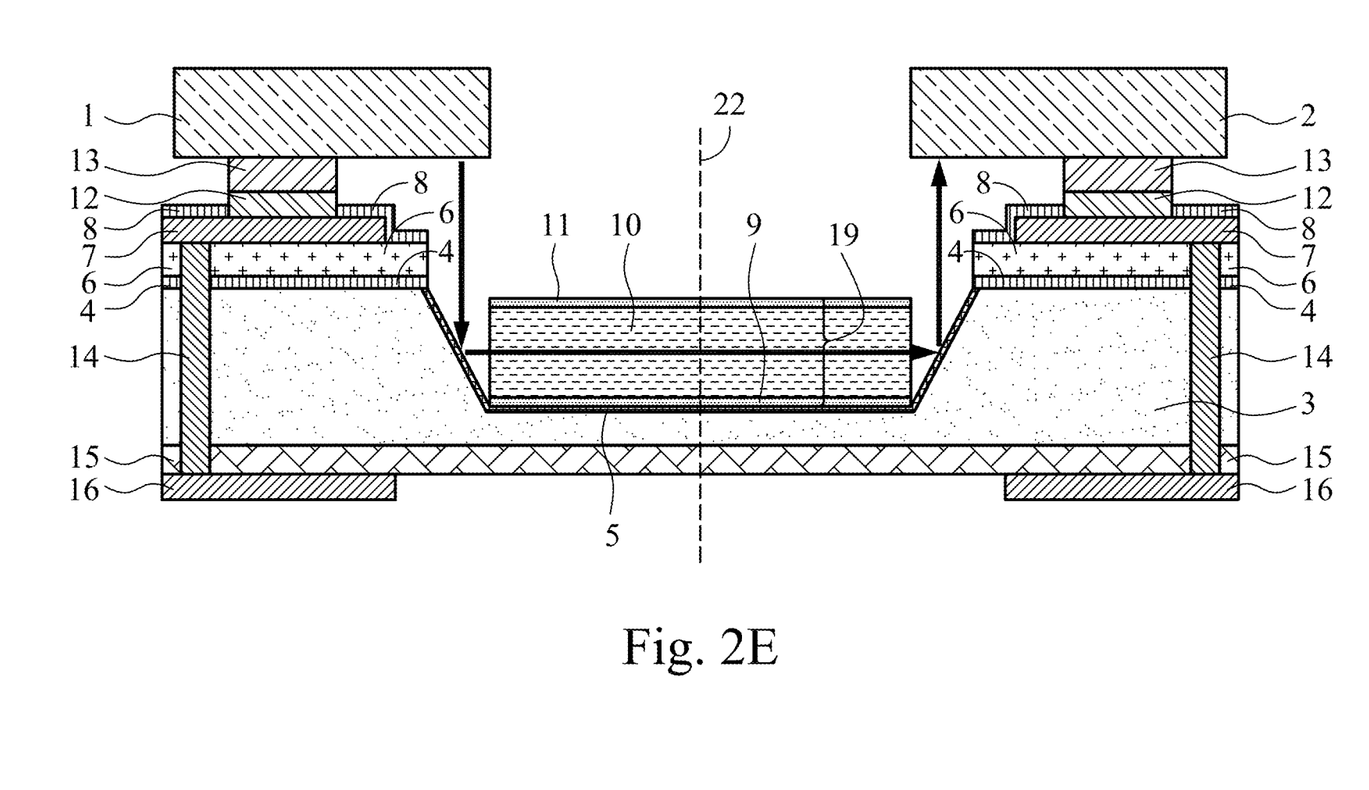

In FIG. 2E, the laser diode 1 and the photo diode 2, as well as other driver or transimpedance amplifier (TIA) chips, are flip-chip mounted (and/or wire-bonded as necessary) over the substrate 3. In FIG. 2E, the portion on the left side of the line 22 is the transmitting portion of the optical bench shown in FIGS. 2A-2D, and the portion on the right side of the line 22 is a receiving portion that can be fabricated in the same or similar process flow described with respect to FIGS. 2A-2D.

Figure 3A:
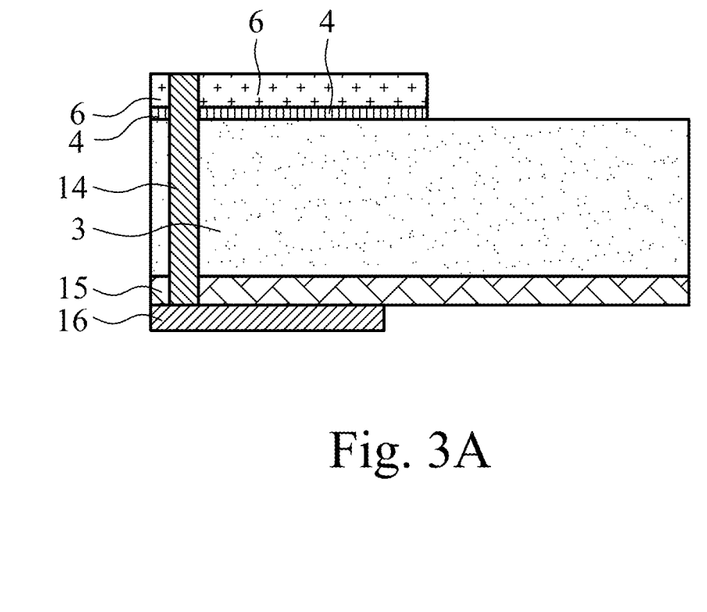
FIGS. 3A-3C are schematic diagrams of various steps of another fabrication process of the optical bench on substrate in FIG. 1 according to some embodiments.
Figure 3B:
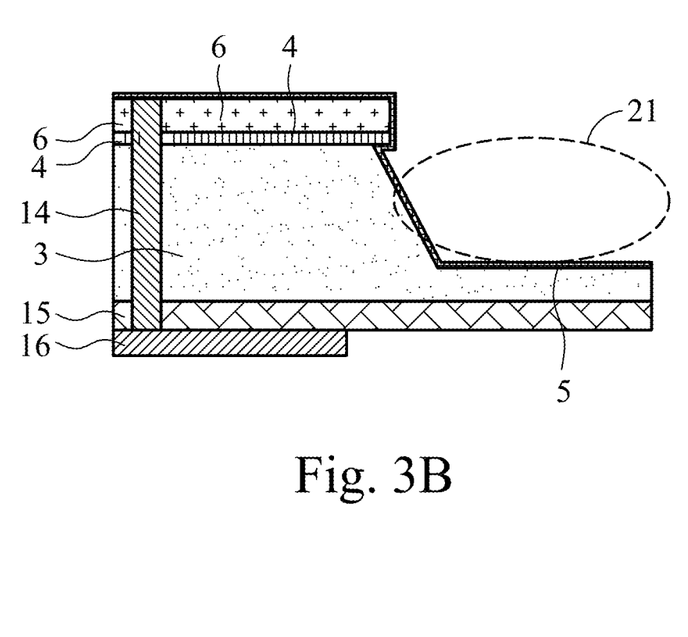
Figure 3C:
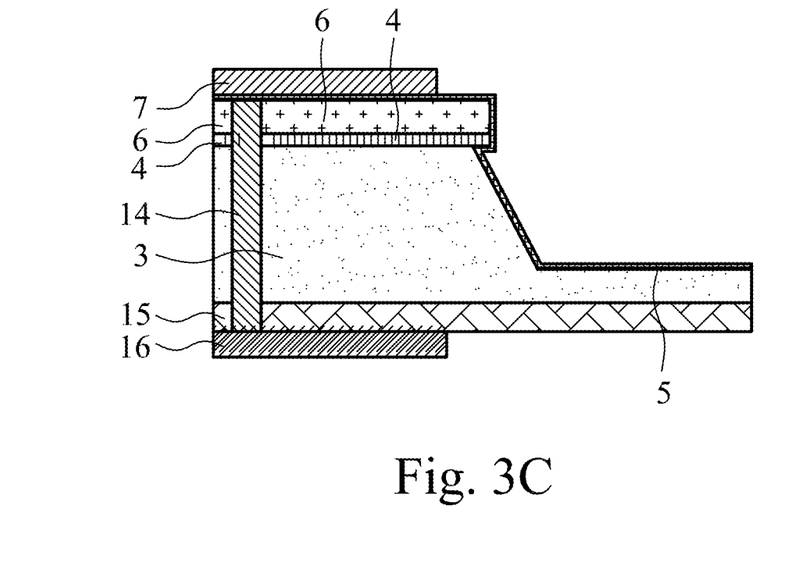

FIGS. 3A-3C are schematic diagrams of various steps of another fabrication process of the optical bench on substrate in FIG. 1 according to some embodiments. In FIG. 3A, the etching hard mask 4 and the dielectric layer 6 are formed over the substrate 3. The etching hard mask 4, e.g., silicon nitride or silicon oxide, and the dielectric layer 6 are removed from an area where the trench 21 is to be formed.

In FIG. 3B, the trench 21 with the slope angle θ (as shown in FIG. 1) is formed by etching, e.g., using KOH(aq)/IPA or TMAH solution. One method to control the anisotropic wet etching is achieved by using KOH (25 wt %-35 wt %) with no less than 5 wt % IPA quantity. The temperature is kept at about 60° C.-70° C. during the wet etching to achieve a reasonable etch rate of 0.2-0.6 micron per minute during the wet etching and to prevent excessive hillock formation.

The reflector layer 5 having a slope angle θ (e.g., 42°-48°) is formed on the sloping side of the trench 21. This step may include depositing an adhesion dielectric layer, then a barrier/adhesion metal layer, such as Ti or Cr, and finally a highly reflective metal such as Al, Cu, Ag, or Au with a thickness greater than 50 nm to achieve reflectivity greater than 90% in some embodiments. The deposition process can be performed by physical vapor deposition (PVD) or electroplating, for example. Any other suitable reflective material or process can also be used. The reflector layer 5 can be removed in areas where it is not necessary by a lithography process in some embodiments.

In FIG. 3C, the RDL 7 is formed and defined for metal routing and metal traces for high speed electrical signal propagation. Additional dielectric layer for electrical isolation and microwave confinement can be formed as necessary. After the step in FIG. 3C, the process flow can proceed to the operation of forming the passivation layer 8 (e.g., silicon nitride or oxide) for metal protection as described with respect to FIG. 2A, and then proceed to the steps described in FIGS. 2C-2E afterwards.

One aspect of this description relates to a method of forming an optical bench. The methods includes forming a trench in a substrate and wherein the trench has a sloping side, forming a reflector layer over the sloping side, depositing a redistribution layer over the substrate, disposing an under bump metallization (UBM) layer over the redistribution layer, forming a passivation layer over the redistribution layer and surrounding sidewalls of the UBM layer, and mounting an optical component over an uppermost portion of the substrate, wherein the optical component is electrically connected to a through substrate via (TSV) extending through the substrate. The reflector layer is configured to reflect an electromagnetic wave from the optical component, and the optical component is mounted outside the trench. In some embodiments, the method further includes forming a waveguide inside the trench. The waveguide is configured to guide the electromagnetic wave to or from the reflector layer. In some embodiments, forming the waveguide includes placing a polymer as an optical path inside the trench. In some embodiments, forming the waveguide includes depositing a bottom cladding layer over a bottom surface of the trench, depositing a core layer over the bottom cladding layer, and depositing a top cladding layer over the core layer. In some embodiments, the method further includes placing an optical fiber inside the trench as a waveguide to guide the electromagnetic wave to or from the reflector layer. In some embodiments, forming the trench in the substrate comprises etching a silicon substrate. In some embodiments, mounting the optical component comprises mounting the optical component over the substrate using flip bonding or wire bonding. In some embodiments, forming the trench includes forming the trench having a slope angle ranging from 42° to 48°. In some embodiments, forming the reflector layer includes depositing at least one of Al, Cu, Ag, or Au.

Another aspect of this description relates to a method of forming an optical bench. The methods includes forming a dielectric layer over a substrate, forming a trench extending through the dielectric layer into the substrate, depositing a reflector layer along sidewalls and a bottom of the trench and on the dielectric layer, depositing a redistribution layer over the dielectric layer, disposing an under bump metallization (UBM) layer over the redistribution layer, forming a passivation layer over the redistribution layer and surrounding sidewalls of the UBM layer, and mounting at least one optical component over an uppermost portion of the substrate. The reflector layer is configured to reflect an electromagnetic wave from the optical component, and the optical component is mounted outside the trench. In some embodiments, depositing the redistribution layer over the dielectric layer includes depositing the redistribution layer over a portion of the reflector layer outside the trench. In some embodiments, depositing the reflector layer includes forming the reflector layer having a reflectivity greater than 90% at selective wavelengths. In some embodiments, the method further includes forming a solder bump layer over the UBM layer. In some embodiments, the mounting the at least one optical component includes mounting the at least one optical component over the solder bump layer. In some embodiments, mounting the at least one optical component includes mounting a laser diode and a photo diode over the UBM layer.

Still another aspect of this description relates to a method of forming an optical bench. The methods includes forming a material stack comprising a dielectric layer and a redistribution layer over a substrate, etching the material stack and the substrate to form a trench in the substrate. The trench has opposite sloping sidewalls and a substantially flat bottom. The method further includes forming a reflector layer over the opposite sidewalls and the bottom of the trench and placing a waveguide over the bottom of the trench. The waveguide extends in a longitudinal direction to span between the opposite sidewalls of the trench. The method further includes mounting an optical component over the redistribution layer. The reflector layer is configured to reflect an electromagnetic wave from the optical component, and the optical component is mounted outside the trench. In some embodiments, etching the material stack and the substrate includes performing an anisotropic wet etch using a KOH/IPA solution. In some embodiments, forming the reflector layer having forming the reflector layer having sloping sides with a slope angle ranging from 42° to 48°. In some embodiments, forming the reflector layer includes depositing an adhesion dielectric layer, depositing a barrier metal layer over the adhesion dielectric layer, and depositing a reflective metal layer over the barrier metal layer. In some embodiments, the method further includes forming a hard mask between the dielectric layer and the substrate and etching the hard mask prior to etching the substrate.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of forming an optical bench, comprising:
   forming a trench in a substrate, wherein the trench has a sloping side;
   forming a reflector layer over the sloping side;
   depositing a redistribution layer over the substrate;
   disposing an under bump metallization (UBM) layer over the redistribution layer;
   forming a passivation layer over the redistribution layer and surrounding sidewalls of the UBM layer; and
   mounting an optical component over an uppermost portion of the substrate, wherein the optical component is electrically connected to a through substrate via (TSV) extending through the substrate, wherein the reflector layer is configured to reflect an electromagnetic wave from the optical component, and wherein the optical component is mounted outside the trench.

2. The method of claim 1, further comprising forming a waveguide inside the trench, wherein the waveguide is configured to guide the electromagnetic wave to or from the reflector layer.

3. The method of claim 2, wherein forming the waveguide comprises forming a polymer as an optical path inside the trench.

4. The method of claim 2, wherein forming the waveguide comprises:
   depositing a bottom cladding layer over a bottom surface of the trench;
   depositing a core layer over the bottom cladding layer; and
   depositing a top cladding layer over the core layer.

5. The method of claim 1, further comprising placing an optical fiber inside the trench as a waveguide to guide the electromagnetic wave to or from the reflector layer.

6. The method of claim 1, wherein forming the trench in the substrate comprises etching a silicon substrate.

7. The method of claim 1, wherein mounting the optical component comprises mounting the optical component over the substrate using flip bonding or wire bonding.

8. The method of claim 1, wherein forming the trench comprises forming the trench having a slope angle ranging from 42° to 48°.

9. The method of claim 1, wherein forming the reflector layer comprises depositing at least one of Al, Cu, Ag, or Au.

10. A method of forming an optical bench, comprising:
    forming a dielectric layer over a substrate;
    forming a trench extending through the dielectric layer into the substrate;
    depositing a reflector layer along sidewalls and a bottom of the trench and on the dielectric layer;
    depositing a redistribution layer over the dielectric layer;
    disposing an under bump metallization (UBM) layer over the redistribution layer;
    forming a passivation layer over the redistribution layer and surrounding sidewalls of the UBM layer; and
    mounting at least one optical component over an uppermost portion of the substrate, wherein the reflector layer is configured to reflect an electromagnetic wave from the optical component, and wherein the optical component is mounted outside the trench.

11. The method of claim 10, wherein depositing the redistribution layer over the dielectric layer comprising depositing the redistribution layer over a portion of the reflector layer outside the trench.

12. The method of claim 10, wherein depositing the reflector layer comprising forming the reflector layer having a reflectivity greater than 90% at selective wavelengths.

13. The method of claim 10, further comprising forming a solder bump layer over the UBM layer.

14. The method of claim 13, wherein the mounting the at least one optical component comprises mounting the at least one optical component over the solder bump layer.

15. The method of claim 10, wherein mounting the at least one optical component comprises mounting a laser diode and a photo diode over the UBM layer.

16. A method of forming an optical bench, comprising:
    forming a material stack comprising a dielectric layer and a redistribution layer over a substrate;
    etching the material stack and the substrate to form a trench in the substrate, wherein the trench has opposite sloping sidewalls and a substantially flat bottom;
    forming a reflector layer over the opposite sidewalls and the bottom of the trench;
    placing a waveguide over the bottom of the trench, wherein the waveguide extends in a longitudinal direction to span between the opposite sidewalls of the trench; and
    mounting an optical component over the redistribution layer, wherein the reflector layer is configured to reflect an electromagnetic wave from the optical component, and wherein the optical component is mounted outside the trench.

17. The method of claim 16, wherein etching the material stack and the substrate comprises performing an anisotropic wet etch using a KOH/IPA solution.

18. The method of claim 16, wherein forming the reflector layer comprises forming the reflector layer having sloping sides with a slope angle ranging from 42° to 48°.

19. The method of claim 16, wherein forming the reflector layer comprises:
    depositing an adhesion dielectric layer;
    depositing a barrier metal layer over the adhesion dielectric layer; and
    depositing a reflective metal layer over the barrier metal layer.

20. The method of claim 16, further comprising forming a hard mask between the dielectric layer and the substrate and etching the hard mask prior to etching the substrate.

* * * * *